(12) United States Patent
Zjajo et al.

(10) Patent No.: US 7,671,618 B2
(45) Date of Patent: Mar. 2, 2010

(54) ANALOG IC HAVING TEST ARRANGEMENT AND TEST METHOD FOR SUCH AN IC

(75) Inventors: Amir Zjajo, Eindhoven (NL); Hendrik J Bergveld, Eindhoven (NL); Rodger F Schuttert, Eindhoven (NL); Jose De Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/091,026

(22) PCT Filed: Oct. 20, 2006

(86) PCT No.: PCT/IB2006/053878

§ 371 (c)(1),
(2), (4) Date: Nov. 14, 2008

(87) PCT Pub. No.: WO2007/049210

PCT Pub. Date: May 3, 2007

(65) Prior Publication Data

US 2009/0134904 A1    May 28, 2009

(30) Foreign Application Priority Data

Oct. 26, 2005  (EP)  ................... 05110048

(51) Int. Cl.
G01R 31/26  (2006.01)
(52) U.S. Cl. .................................... 324/765
(58) Field of Classification Search ............... 324/765, 324/763, 158.1, 537; 257/48; 438/14–18; 714/726
See application file for complete search history.

(56) References Cited

U.S. PATENT DOCUMENTS

| 5,793,778 | A   | 8/1998  | Qureshi        |          |
|-----------|-----|---------|----------------|----------|
| 5,923,097 | A   | 7/1999  | Corriveau et al. |        |
| 6,501,400 | B2* | 12/2002 | Ali            | 341/118  |
| 6,737,627 | B2* | 5/2004  | Moses et al.   | 250/208.1 |

* cited by examiner

Primary Examiner—Ha Tran T Nguyen
Assistant Examiner—Tung X Nguyen

(57) ABSTRACT

An integrated circuit (IC) comprises a plurality of analog stages (10a-c), each of the analog stages being conductively coupled to a power supply (20; 20a-c), and being conductively coupled to each other by a signal path (12); and a test arrangement for testing the plurality of analog stages, the test arrangement comprising input means such as an analog bus (40) coupled to a signal path input of each analog stage from the plurality of analog stages, output means such as a further analog bus (50) for communicating a test result to an output of the integrated circuit, switching means such as a plurality of switches (36) in the biasing infrastructure of the IC for selectively disabling an analog stage, and control means such a shift register (60) for controlling the switching means. Consequently, the analog stages of the IC can be tested and debugged in isolation without the need for switches in the signal path through the cores. A current sensor (70) may be present in the power supply to facilitate structural testing of the analog stages in isolation.

25 Claims, 5 Drawing Sheets

ANALOG IC HAVING TEST ARRANGEMENT AND TEST METHOD FOR SUCH AN IC

Figure 1:
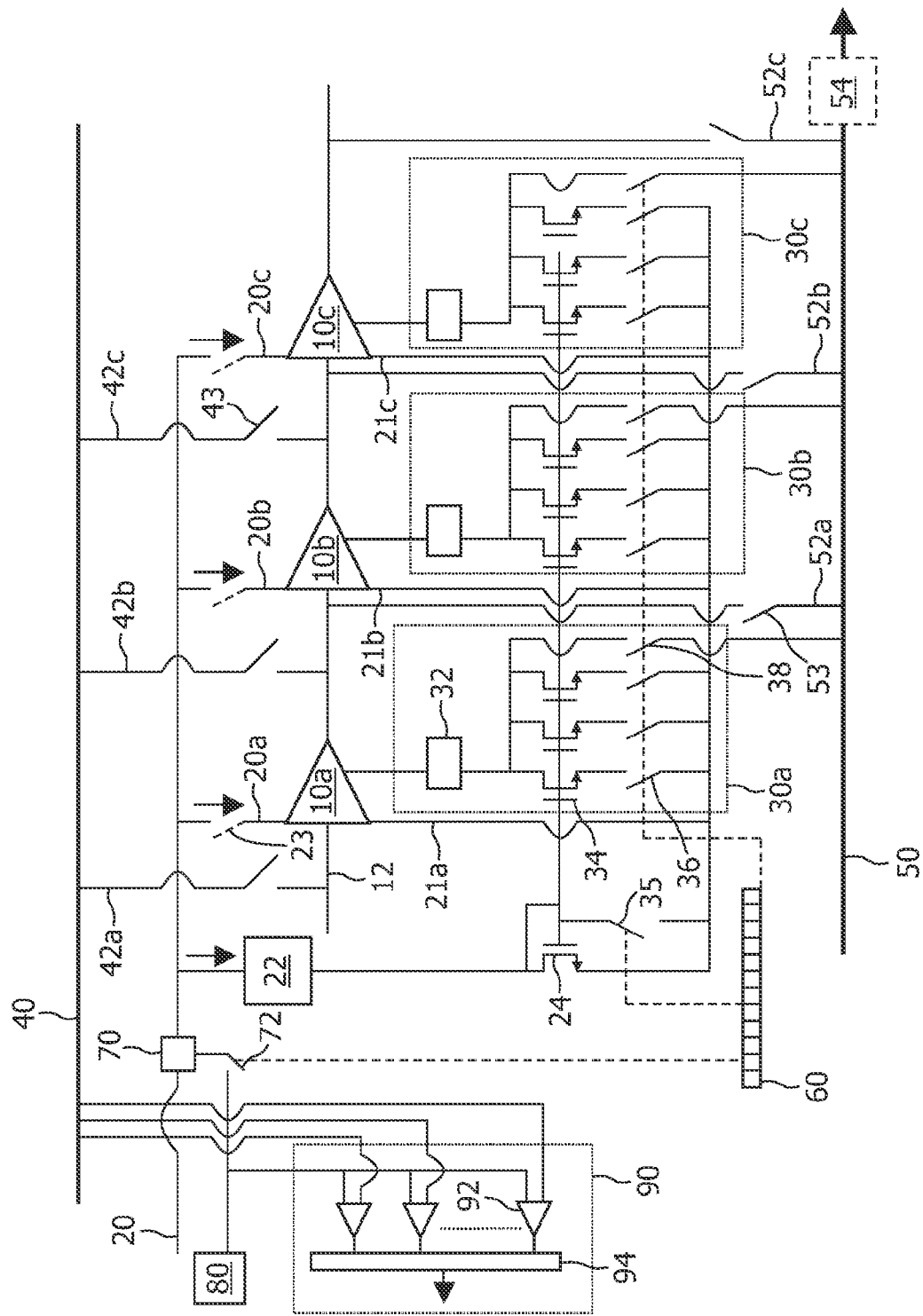

The present invention relates to an integrated circuit (IC) comprising a plurality of analog stages, each of the analog stages being conductively coupled to a power supply, and being conductively coupled to each other by a signal path; and a test arrangement for testing the plurality of analog stages.

The present invention further relates to a test method for such an IC, and to a IC test arrangement including such an IC.

Nowadays, IC testing is an essential and integral part of the IC manufacturing process. IC testing plays an important role in improving the manufacturing process by detecting flaws in this process. Moreover, IC testing largely prevents the unwanted sale of faulty ICs to the customers of the IC manufacturers. The increasing complexity and modularity of ICs, e.g. systems on chip (SoCs), has led to the development of new testing techniques for digital ICs such as the recently agreed SoC test standard IEEE 1500, in which the various modules, or cores, can either be tested individually or in groups of cores, including a system-level test by selectively connecting the cores to a test signal path via scan chains surrounding the digital cores.

Unfortunately, such standardized test methods do not exist for systems including analog stages, e.g. mixed-signal ICs and analog ICs. Although a test standard has been agreed to test the interconnects of analog ICs (IEEE 1149.4), this standard has not been utilized yet, mainly because the integration of switches in the signal path of an analog IC influences the signals travelling over such paths, which is highly unwanted.

U.S. Pat. No. 5,923,097 discloses an IC having a test arrangement for testing cores in isolation. Each core has an individual on-board power supply in the form of an operational amplifier in test mode, which means that only a single external power supply signal has to be provided from which the amplifiers are fed. The cores can be individually selected for testing by providing the core with the appropriate test signals, which power up the appropriate operational amplifiers. This test arrangement has the drawback that dedicated amplifiers are required for selectively powering the cores, which significantly adds to the overall area of the IC.

Consequently, the present invention seeks to provide an integrated circuit according to the opening paragraph in which the inclusion of switches in the signal path can be avoided, and which does not have a significant area overhead.

The present invention further seeks to provide a test method for such an IC, as well as an IC test arrangement including such an IC.

According to a first aspect of the invention, there is provided an integrated circuit comprising a chain of analog stages, each analog stage having a signal input and a signal output, the signal output of a predecessor analog stage in the chain being coupled to the signal input of a successor analog stage in the chain; powering means for powering the analog stages, the powering means comprising a power supply infrastructure and a biasing infrastructure, each analog stage being coupled to a branch of the power supply infrastructure and a branch of the biasing infrastructure; and a test arrangement for testing the analog stages, the test arrangement comprising: test data input means, each analog stage having its signal input configurably coupled to the test data input means; test data output means, each analog stage having its signal output configurably coupled to the test data input means; selection means located in the powering means for selectively decoupling an analog stage from the powering means; and control means for controlling the selection means and the configurable coupling of an analog stage to the test data input means and the test data output means.

The integration of the switching means in the powering means, e.g. in the branches of the power supply infrastructure or the biasing infrastructure of the IC to facilitate selective enabling of a stage in combination with the configurable coupling of the input and output of the selected stage to the test data input and output means respectively has the advantage that the signal path through the analog stages remains largely or even completely unaffected by the switching means, thus avoiding the potential interference caused by those switching means with the signals travelling on the signal path. The configurable coupling of the inputs and outputs of the analog stages to the test data input means and the test data output means respectively is preferably implemented by switches in branches between the signal path through the analog stages and the test data input means and the test data output means respectively under control of the control means. Because these switches are not located in the signal path of the IC, the behaviour of the IC in functional mode is not significantly affected by these switches; the presence of these switches may add some parasitic capacitance to the inputs or outputs of an analog stage, but the impact of this capacitance, when present, is much smaller than the impact of the presence of a switch in the signal path.

The preferred location of the switching means such as a plurality of switches is in the branches of the biasing infrastructure. This is based on the realization that disconnecting a stage from its biasing infrastructure will effectively switch off such a stage, because the bias provided by the biasing infrastructure, which for instance may be a biasing voltage or a biasing current, is required by the stage for its functioning. This can be implemented by relatively small switches that do not cause a significant voltage drop over the switch, in contrast to switches in the branches of the power supply infrastructure, which have to be larger to accommodate the supply of sufficiently large currents to the associated analog stages.

In a preferred embodiment, the control means comprise a shift register with the switching means being responsive to said shift register. Consequently, the analog stage test configuration can be simply selected by feeding an appropriate bit pattern into the shift register.

In an embodiment, the test arrangement comprises current sensing means for measuring a current signature of the integrated circuit in a test mode. This facilitates structural testing of an analog stage either in isolation or in combination with other stages, and the test arrangement may further comprise an N-bit digitizing stage coupled between the sensing means and an output of the integrated circuit, N being a positive integer, to provide a digital test result to an output of the IC under test. The current sensing means may comprise a plurality of current sensors, each of the current sensors being placed in a branch of the power supply to a respective analog stage, and each current sensor may be coupled to a respective N-bit digitizer for digitizing an output of its associated current sensor, with the respective outputs of the N-bit digitizers being coupled to a digital data bus.

In an alternative embodiment, which may be combined with the previous embodiments, the test data input means comprise an analog bus and the test data output means comprise a further analog bus. The analog bus and the further analog bus may be different wires of a single bus. This facilitates the functional testing of the analog stages on board the IC. The output means may further comprise an N-bit digitizing stage coupled between the further analog bus and an output of the integrated circuit, N being a positive integer for providing the functional test result in a digital form.

The N-bit digitizing stage may comprise a comparator having an input coupled to the further analog bus, a further input coupled to a reference signal source and an output for outputting a comparator result signal in order to provide a pass/fail signal for the one or more analog stages under test. The reference signal source may comprise the analog bus.

In another embodiment, the IC further comprises a plurality of N-bit digitizing stages with N being a positive integer and a plurality of further switches, each of the digitizing stages being coupled to a conductive path from an output of a respective analog stage to the further analog bus via a further switch from the plurality of further switches. Preferably, a further shift register is also present for controlling the plurality of further switches. This facilitates the testing of aggregates of cores with just a single switch being placed in the signal path, i.e. the switch of the N-bit digitizing stage belonging to the last core in the aggregate of cores under test.

Preferably, the shift register and the further shift register are registers from a test access port (TAP) controller, which may be an IEEE 1149.1 or IEEE 1149.4 compliant TAP controller.

According to another aspect of the invention, there is provided a method for testing an integrated circuit comprising a chain of analog stages, each analog stage having a signal input and a signal output, the signal output of a predecessor analog stage in the chain being coupled to the signal input of a successor analog stage in the chain, powering means for powering the analog stages, the powering means comprising a power supply infrastructure and a biasing infrastructure, each analog stage being coupled to a branch of the power supply infrastructure and a branch of the biasing infrastructure, the method comprising providing a test arrangement for testing the plurality of analog stages, the test arrangement comprising test data input means, each analog stage having its signal input configurably coupled to the test data input means, each analog stage having its signal output configurably coupled to the test data output means; selection means located in the powering means for selectively decoupling an analog stage from the powering means; and control means for controlling the selection means and the configurable coupling of an analog stage to the test data input means and the test data output means; connecting one or more analog stages to the powering means by configuring the switching means through the control means; providing test data via the test data input means to an analog stage that is connected to the powering means; and collecting a test result from said connected analog stage.

This method has the advantage that an IC with analog stages can be tested without the need for switches in the signal path through the stages, and without the need for area-consuming dedicated test hardware.

Figure 2:
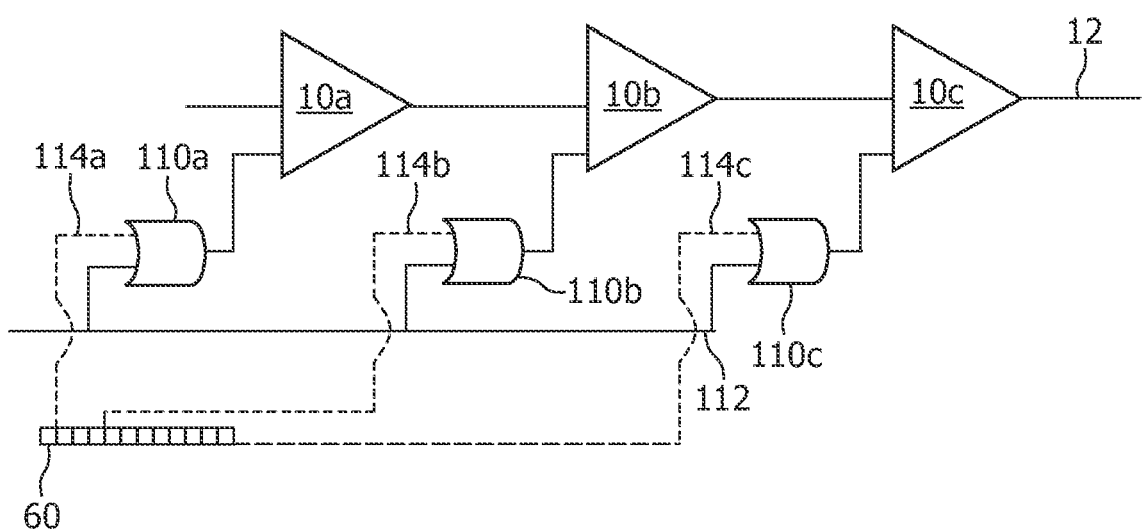
Figure 3:
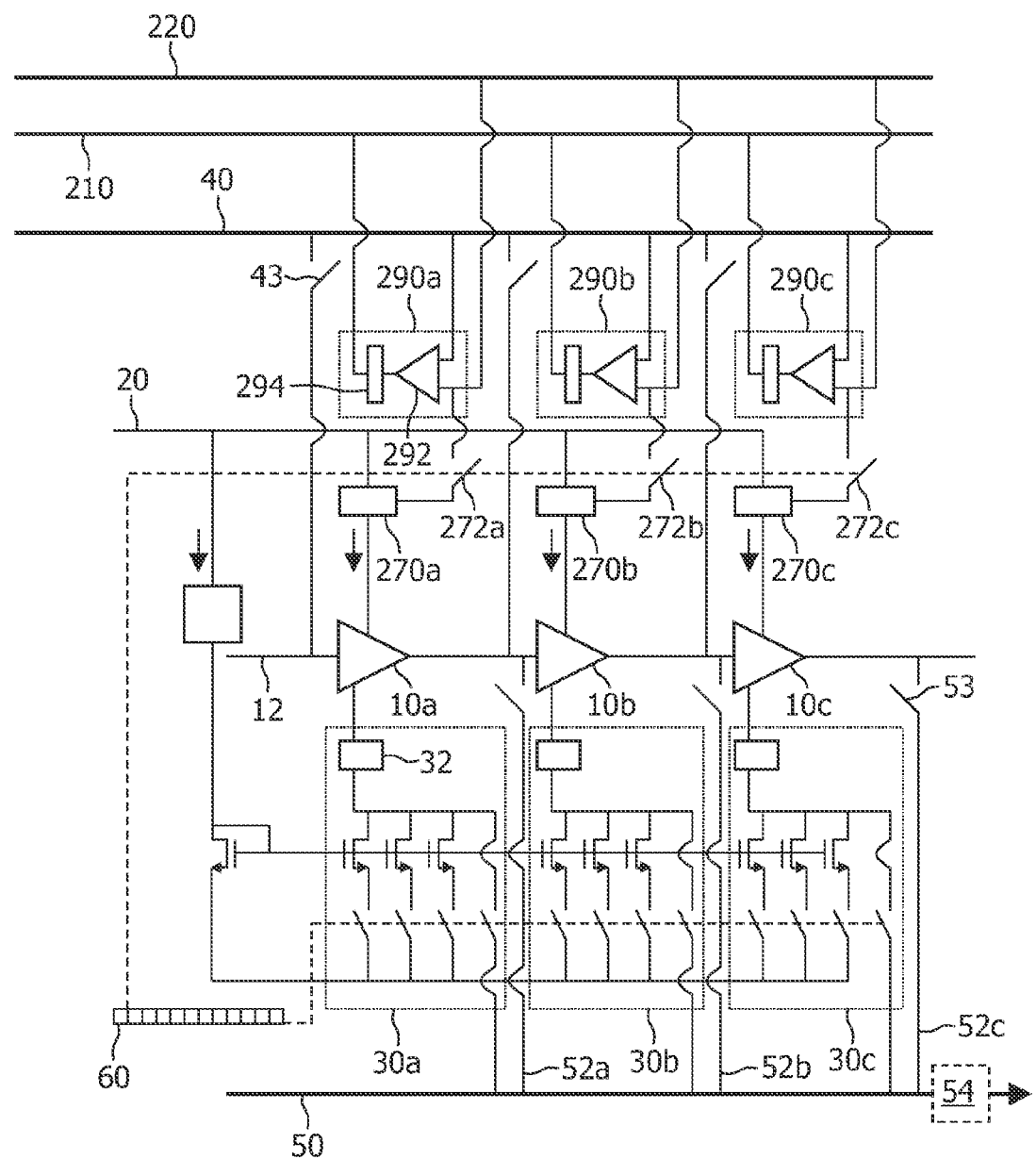
Figure 4:
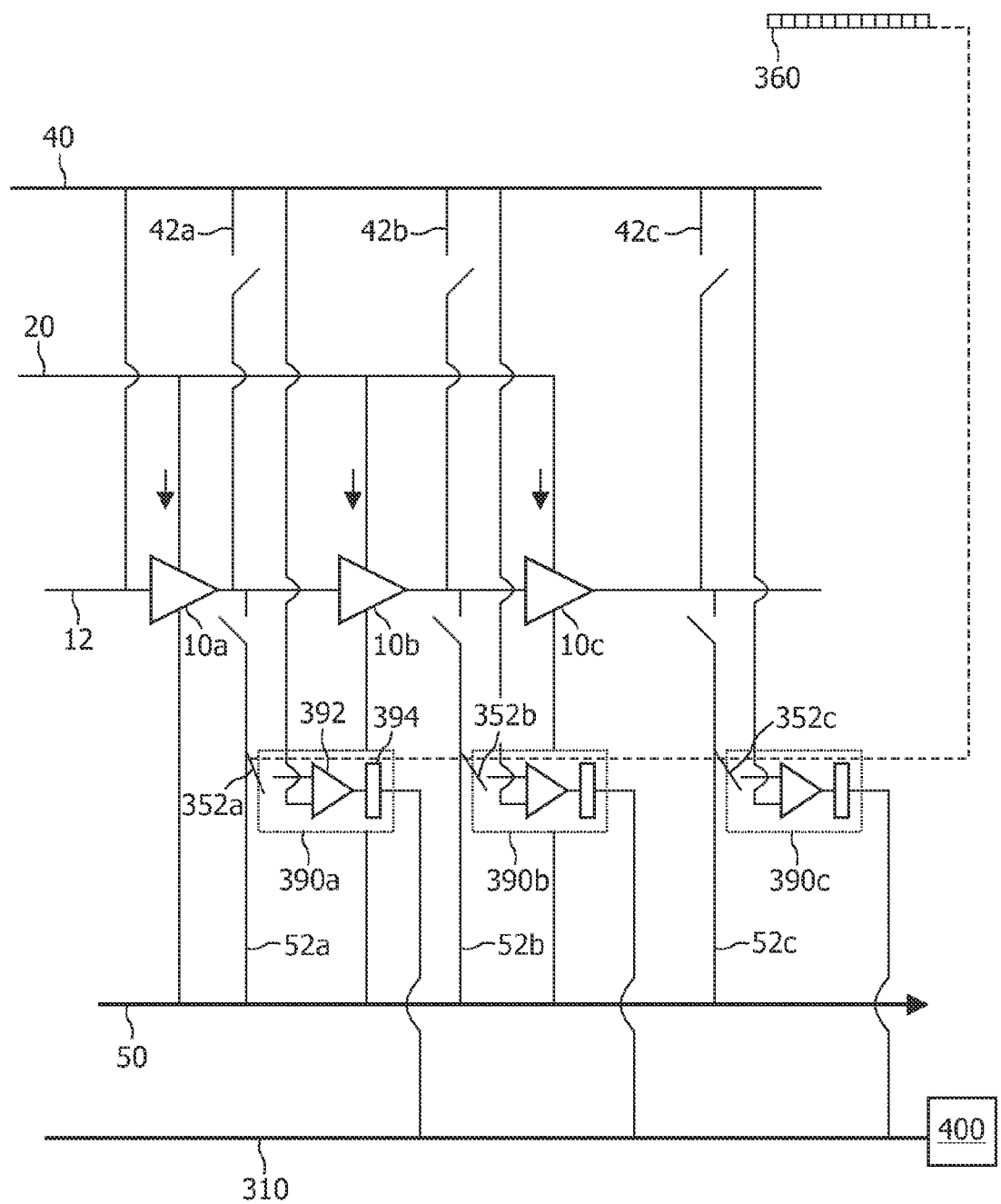
Figure 5:
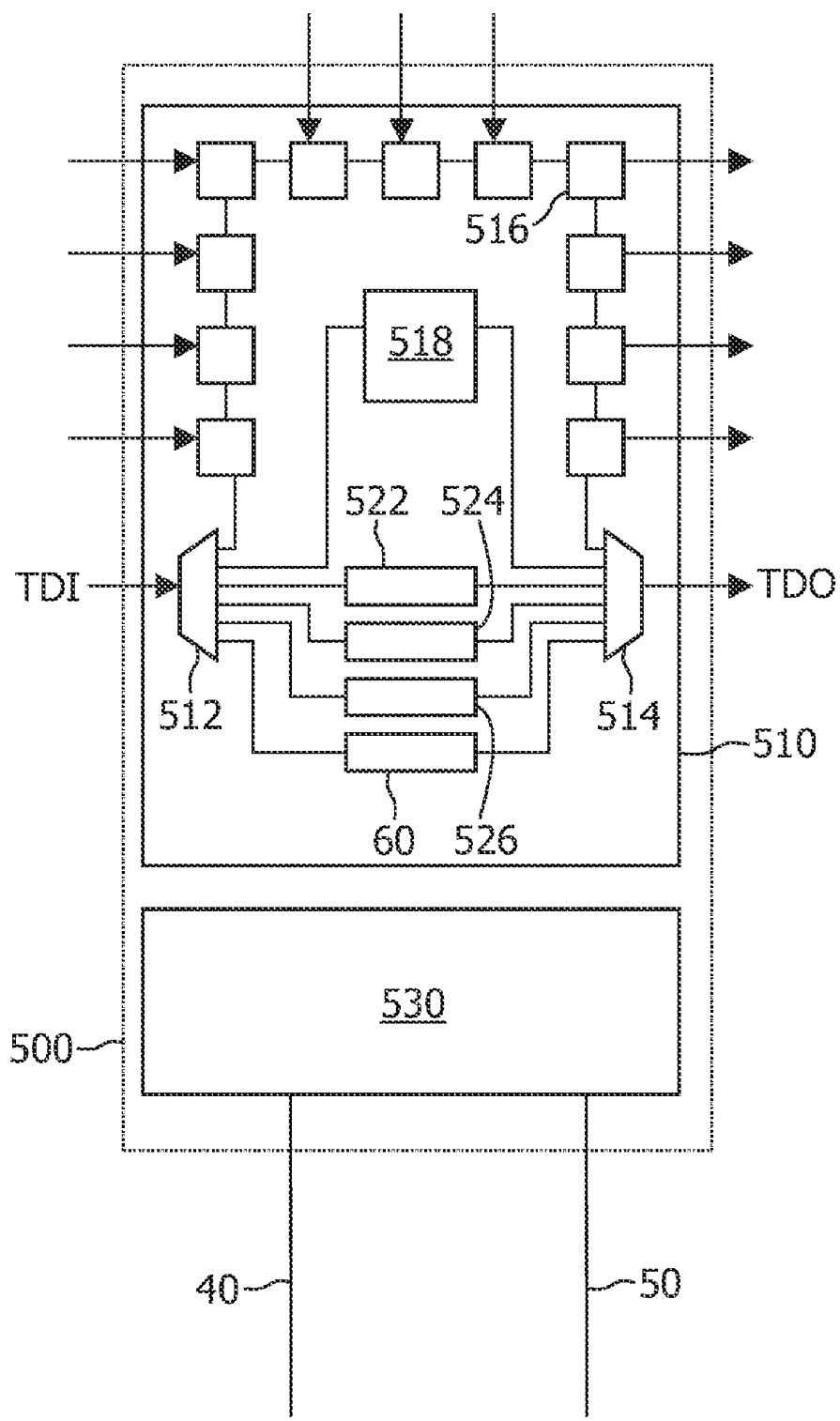

The invention is described in more detail and by way of non-limiting examples with reference to the accompanying drawings, wherein:

FIG. 1 schematically shows an integrated circuit having analog stages and an embodiment of the test arrangement of the present invention;

FIG. 2 schematically shows an embodiment of an individual power down arrangement for the analog stages for use in conjunction with the present invention;

FIG. 3 schematically shows another aspect of the IC test arrangement of the present invention;

FIG. 4 schematically shows yet another aspect of the IC test arrangement of the present invention; and FIG. 5 shows a preferred embodiment of a test controller for controlling the IC test arrangement of the present invention.

It should be understood that the Figures are merely schematic and are not drawn to scale. It should also be understood that the same reference numerals are used throughout the Figures and their detailed description to indicate the same or similar parts. Moreover, it should be understood that the various aspects of the invention shown in different Figures and explained in the detailed description thereof have been separately shown for reasons of clarity only; they may be combined without departing from the teachings of the present invention.

FIG. 1 shows an IC having analog stages 10a-c. The analog stages 10a-c are conductively coupled to the power supply line 20 via their respective branches 20a-c and 21a-c for providing a supply voltage to the stages 10a-c, and share a signal path 12. In FIG. 1, the voltages on the internal nodes of the analog stages 12a-c are biased to their appropriate values by a biasing infrastructure. It is emphasized that it will be obvious to the skilled person that various types of biases, e.g. voltage-based biases or current-based biases, may be provided to an analog stage, and that the disclosure of a voltage bias to the analog stages 10a-c is by way of non-limiting example only. Moreover, it is pointed out that the use of the phrase 'infrastructure' is intended to also cover embodiments in which one or more stages have independent, isolated power/and or bias supplies.

The biasing infrastructure in FIG. 1 comprises, by way of non-limiting example, a bandgap circuit 22 coupled to an input 24 of a current mirror, and a plurality of branches 30a-c comprising respective biasing elements 34, each of which implement a leg of said current mirror for its associated analog stage 10a-c, with each of the plurality of branches being coupled to its respective analog stage via a bias generating circuit 32. The biasing elements 34 in the multiple legs of the current mirror may be implemented as nMOS or pMOS transistors having appropriately chosen device parameters, although many other implementations of a biasing infrastructure are equally feasible since the invention amongst others is based on the realization that an analog stage can be disabled by disabling any bias that has to be applied to said stage for the (correct) functioning of said stage.

In the preferred embodiment of the invention, each branch of the plurality of branches 30a-c comprises a switch 36, e.g. a transistor of known technology, for disconnecting said branch from the bias supply. By disconnecting a stage 10 from its bias supply, it is effectively powered down. However, the opening (disabling) of the appropriate switches 36 does not necessarily avoid the presence of floating nodes in a powered down stage 10. Such floating nodes can be unwanted, especially when the test of another (enabled) stage 10 involves measuring the supply current or current signature, in which case the floating nodes can influence such a measurement, because the (flaoating nodes of the) disabled stage is still connected to the power supply. For this reason, an analog stage 10 that is disabled by means of disabling its associated switch or switches 36 is preferably also provided with a power-down signal. Such a power-down signal effectively ties the gates of at least those transistors of the analog stage that are prone to generate floating nodes to a fixed potential, e.g. ground or Vdd to effectively switch off these transistors. Obviously, this may be extended to all transistors of the stage 10. This way, a powered down stage will not produce a residual current or voltage signature, and a current or voltage (signature) reading from a stage under test will not be obscured by such residual signatures.

The switches 36 are controlled by one or more test controllers, preferably implemented as one or more shift registers such as shift register 60 in FIG. 1, although other implementations are feasible, such as a test instruction controlled state machine. Each switch 36 may be controlled by an individual control line from the shift register 60, or the switches 36 within a single plurality of branches, e.g. plurality of branches 30a, may all be controlled by a single control line, as indicated by the dashed line from the shift register 60 to the switches 36. If a separate control line is used for each switch, the bias voltage (or bias current) generated by the bias infrastructure can be varied as well, which has the advantage that the bias infrastructure itself can also be accurately tested, as will be explained in more detail later.

A switch 35 under control of the test controller, e.g. shift register 60 may also be present to switch off the complete bias infrastructure, e.g. by disabling biasing elements 34 as shown in FIG. 1.

The test arrangement further comprises an analog bus 40, which is coupled to the inputs of the analog stages 10a-c via conductive paths 42a-c and switches 43 and a further analog bus 50, which is coupled to the outputs of the analog stages 10a-c via conductive paths 52a-c and switches 53. Switches 43 and 53 may be controlled by shift register 60 or another suitable control mechanism, e.g. another shift register (not shown). The presence of switches 43 and 53 ensures that the signal path 12 through the chain of analog stages 10a-c is disconnected from the test data input and output means during functional mode. The further analog bus 50 may also be coupled to the various parts of the biasing infrastructure via respective switches 38. This facilitates testing of the biasing infrastructure; for instance, by powering down one of the stages 10a-c and enabling an appropriate switch 38 to connect the part of the bias infrastructure of the powered down stage 10 to the analog output bus 50, the functioning of the selected part of the biasing infrastructure can be observed via the further analog bus 50. Selective disabling of associated switches 36 further improves the testability of the part of the biasing infrastructure under test.

The further analog bus 50 may be coupled to an N-bit analog to digital converter 54, with N being a positive integer, for digitizing the test results. This arrangement facilitates the functional testing of one or more analog stages (or the biasing infrastructure) in the following manner. An appropriate bit pattern is shifted into the shift register 60 to enable the switches 36 of one of the analog stages 10a-c that is selected for testing, thus connecting this stage to the biasing infrastructure of the IC, and the appropriate switches 43 and 53 for coupling this stage to the analog bus 40 and the further analog bus 50 are also enabled. Subsequently, the test patterns, e.g. analog waveforms, are provided to the signal path input of the selected analog stage under test via the analog bus 40 for functionally testing the selected stage, after which the test results are collected from the circuit under test and the analog test output bus 50 respectively. Analog bus 40 and further analog bus 50 may be a shared I/O bus, as previously stated.

To ensure that the deselected analog stages do not obscure the test results of the analog stage selected for test, each core that is not selected for testing is provided with a local power down signal to prevent the presence of floating nodes in those stages, which could cause the aforementioned noise on the signal path 12, as previously explained. The power down signal may be a dedicated signal provided by either the test controller or a controller that is present to power down the stages 10a-c in functional mode. The signal for disabling selected switch(es) 36 may also be used as a power down trigger for the associated core 10.

A possible way of providing the cores 10a-c with a local power down signal is given in FIG. 2. Each analog stage 10a-c is provided with a global, system-level, power down signal 112 and respective local power down signals 114a-c, which may be derived directly or indirectly from the shift register 60. An example of an indirect derivation is a derivation of the local power down signal from a state of a switch 36 in the associated plurality of branches 30 of the biasing infrastructure. Each core 10a-c is arranged to receive a power-down signal from the output of a respective logic OR gate 110a-c, which has its input coupled to the appropriate local power down signal line 114a-c and to the global power down signal line 112. This ensures that its associated core is powered down when at least one of its inputs, i.e. one of the power down lines, is activated. The power down signal may also be provided to the appropriate switches 36 for disabling the appropriate branches of the biasing infrastructure at the same time, in which case a power down signal generator (not shown) will be responsive to the test controller, e.g. shift register 60. It will be obvious that many other implementations of the generation of a power-down signal can be thought of; for instance, in FIG. 1, the bias generation blocks 32 may be configured to generate such a signal for its associated analog stage 10 in the absence of an input from the legs of the biasing infrastructure to which block 32 is coupled, i.e. when its associated switches 36 are disabled.

Now, returning to FIG. 1, the test arrangement of the present invention can also be used for structural testing of analog stages 10a-c in isolation. To this end, a sensor 70 is included in the power supply line 20, which measures the supply current in response to a supply current signature in response to a test stimulus such as a supply voltage sweep or test signal sweep provided to the analog stage under test, with the other analog stages being kept in a powered down state, as previously explained. Alternatively, a functional test result in which the current signature of the stage under test in response to a test signal applied to the stage via the analog bus 40 may be obtained this way. The sensor 70 may be placed on board the integrated circuit or external thereto, e.g. on board an IC test apparatus such as an automated test equipment (ATE), in which case an integrated circuit test arrangement according to the present invention would be obtained. Consequently, the readings of the sensor 70 correspond with the power consumption signature of the stage under test. The sensor 70 may be responsive to a switch 72, which may be controlled by the control means, e.g. shift register 60.

In a similar fashion, the bandgap circuit 22 can be tested by switching the bandgap circuit on and off and measuring the difference in the supply current with sensor 70.

The sensor readings may be processed in analog form in processing stage 80, which may be on-chip or at least partly off-chip, e.g. on board the aforementioned automated test apparatus. The processing stage 80 typically comprises an amplifier, and a signal processor, and may comprise a memory for storing individual sensor readings. This facilitates post processing of groups of individual readings, e.g. comparison of various individual sensor readings with each other. Alternatively, the sensor readings may be processed in a digital stage 90, which is implemented as an N-bit flash digitizer, with N being a positive integer, by way of example only; other known implementations of A/D converters are equally feasible. The digital stage 90 may comprise N comparators 92, with N being a positive integer and a digital decoder 94. The comparators 92 are arranged to compare the sensor reading to a reference signal such as a threshold voltage ($V_{th}$) reference from a reference signal source, e.g. the analog bus 40. In case of N>1, the reference voltages of the various comparator stages typically are different to each other, and may be provided by a resistor ladder or by other well-known ways for providing reference levels in multistage comparators such as flash converters. A further switch (not shown) responsive to the control means, e.g. shift register 60, may be present to switch between the analog processing stage 80 and the digital stage 90.

Alternatively, each branch 20a-c of the power supply 20 to the respective cores 10a-c may incorporate a respective sensor 270a-c for sensing a voltage or current signature of the respective associated analog stages 10a-c, as shown in FIG. 3. Each of the current sensors 270a-c may be activated by respective switches 272a-c under control of shift register 60 or another controller (vide infra), and may have their outputs coupled to the further analog bus 50 for outputting the measured signatures.

Alternatively, each sensor 270a-c may be coupled to a respective N-bit digitizing stage 290a-c, with N being a positive integer. Each digitizing stage 290a-c comprises one or more comparators 292, which receive their reference signals, e.g. $V_{th}$ (or various reference levels in case of N>1 as previously explained), from a reference signal source such as the analog bus 40, and a clocked digital data storage element 294, e.g. a flipflop, which may be clocked by the system clock of the IC or by an external clock signal, e.g. a clock signal from the automated test equipment. The respective digital storage elements are coupled to a digital data output bus 210, whereas the analog output of each of the sensors 270a-c may be coupled to the further analog bus 50 or a second further analog bus 220. The presence of sensors 270a-c in the individual branches 20a-c of the power supply 20 to the cores 10a-c facilitates the structural testing of several analog stages 10a-c in parallel, which significantly reduces the required test time for the structural test of the analog stages 10a-c. It will be appreciated that other sensors, such as sensor 70 for sensing the transient bandgap voltage (not shown in FIG. 3) may also be present.

Another aspect of the invention, which may be combined with other aspects of the invention already described, is shown in FIG. 4. The biasing infrastructure of the IC is not shown in FIG. 4 for reasons of clarity only. In addition to the conductive paths 52a-c to the further analog bus 50, the respective cores 10a-c also have their outputs conductively coupled to respective N-bit digitizing stages 390a-c, with N being a positive integer, via respective switches 352a-c controlled by further control means, e.g. a further shift register 360. Each of the digitizing stages 390 may comprise one or more comparators 392 receiving N reference signals (with N being the level, i.e. the number of stages, of the comparator, as previously explained) from the analog bus 40 and the output from its associated analog stage, and provides its result signal to a data storage element 394, e.g. a flipflop under control of a system clock signal or an external clock signal, such as the clock signal provided by the ATE. The data storage elements 394 are coupled to a digital data output bus 310, which may be coupled to an on-chip or off-chip digital data processing stage 400 for processing the digital test results. This processing stage 400 may comprise a memory for storing a number of test results for subsequent comparison of these test results, for instance.

The presence of the digitizing stages 390a-c under control of a separate shift register 360 facilitates a flexible configuration of the arrangement under test; each of the analog stages 10a-c may be tested in isolation, or a chain of the analog stages 10a-c may be tested, with only the digitizing stage of the last core in the chain selected by the bit pattern shifted into the shift register 360, in which case a test result from an aggregate of cores is obtained from the selected digitizing stage associated with the last core in the chain with a reduced number of switches in the signal path compared to known test arrangements.

Alternatively, the switches 352a-c may instead be controlled by the control means, e.g. shift register 60, although this would result in a test arrangement having less flexibility.

At this point, it is emphasized that in FIGS. 1-4 the IC is shown to have analog stages 10a-c by way of non-limiting example only; further analog blocks as well as digital blocks may be present without departing from the teachings of the present invention.

Also, instead of disabling an analog stage by means of removing its bias supply, an analog stage may also be disabled by means of a switch 23 in branch 20 or 21 of its power supply, which has the advantage that no further power down architecture is required to avoid the occurrence of floating nodes in a disabled stage 10. However, this alternative embodiment has the drawback that large switches 23, e.g. transistors, have to be used to facilitate the supply of large enough currents to the stages 10. This can introduce voltage drops over these switches, which will have to be compensated for. For this reason, the use of switching means in the biasing infrastructure is preferred, for instance because smaller switches can be used that suffer less from the aforementioned problem.

FIG. 5 shows a preferred embodiment of test controller 500 for use in conjunction with the previously described test arrangement. The test controller comprises a boundary scan, i.e. IEEE 1149.1, compliant test access port (TAP) controller 510. The TAP controller typically comprises an input multiplexer (MUX) 512 for receiving test data input (TDI) signals, and an output multiplexer (MUX) 514 for providing test data output (TDO) signals. Between the MUX 512 and MUX 514, a number of shift registers is placed, e.g. a boundary scan register 516, a shift register 518 internal to some core logic of the IC having the test arrangement, a bypass register 522, an instruction register 524, an identification register 526 and switching means control shift register 60. In addition, the further shift register 360 may also be present in TAP controller 510; this is however not shown in FIG. 5. The TAP controller 510 is responsive to the IEEE 1149.1 mandated test mode select, test clock and, optionally, to the test reset signal. These signals are not shown in FIG. 5 for reasons of clarity only.

The test controller 500 is extended with an analog bus controller 530 for controlling analog buses 40 and 50; the analog bus controller preferably is an IEEE 1149.4 compliant controller. The operation of the TAP controller 510 and the bus controller 530 are well-known to those skilled in the art and will not be further elaborated upon for that reason.

Other control arrangements for controlling the shift registers are also feasible, e.g. an I2C bus or a 3-wire bus. However, the use of an IEEE 1149.1 compliant TAP controller has the advantage that access to the shift registers of the TAP controller can be gained while the device under test is in functional mode. This facilitates on-chip silicon debugging; for instance, the tuning of the biasing infrastructure can be varied for one of the selected analog stages 10a-c, which may be combined with the application of various test input patterns via the analog bus 40. Another example is the debugging of the bandwidth and insertion loss of an analog filter in response to signals applied to the filter via the analog bus 40. Many other examples where the real-time behaviour of an analog component can be evaluated with the aid of the test arrangement of the present invention can be easily thought of.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising: a chain of analog stages sharing a signal path by each analog stage having a signal input and a signal output, the signal output of a predecessor analog stage in the chain being coupled to the signal input of a successor analog stage in the chain;
   powering means for powering the analog stages, the powering means comprising a power supply infrastructure and a biasing infrastructure, each analog stage being coupled to a branch of the power supply infrastructure and a branch of the biasing infrastructure; and
   a test arrangement for testing the analog stages the test arrangement comprising:
   test data input means, each analog stage having its signal input configurably coupled to the test data input means;
   test data output means each analog stage having its signal output configurably coupled to the test data output means;
   selection means located in the powering means for selectively decoupling an analog stage from the powering means; and
   control means for controlling the selection means and the configurable coupling of an analog stage to the test data input means and the test data output means.

2. An integrated circuit as claimed in claim 1, wherein the selection means comprise a plurality of switches.

3. An integrated circuit as claimed in claim 2, wherein each switch is placed in a respective branch the power supply infrastructure.

4. An integrated circuit as claimed in claim 2, wherein each switch is placed in a respective branch of the biasing infrastructure.

5. An integrated circuit as claimed in claim 4, wherein the switching means comprise a further plurality of switches, each switch of said further plurality being placed in a respective branch of the power supply infrastructure.

6. An integrated circuit as claimed in claim 4, comprising a second further plurality of switches coupled between respective parts of the biasing infrastructure and the test data output means for enabling testing of the biasing infrastructure, each part of the biasing infrastructure belonging to a respective analog stage from said chain.

7. An integrated circuit as claimed in claim 1, wherein the test data input means comprise an analog bus.

8. An integrated circuit as claimed in claim 1, wherein the test data output means comprise a further analog bus.

9. An integrated circuit as claimed in claim 1, wherein the control means comprise a shift register coupled to the selection means.

10. An integrated circuit as claimed in claim 1, wherein each analog stage is configurably coupled to the test data input means and the test data output means via respective switches in respective branches between the signal path through the stages and the test data input means and the test data output means respectively.

11. An integrated circuit as claimed in claim 1, wherein the test arrangement further comprises current sensing means for measuring a current signature of the integrated circuit.

12. An integrated circuit as claimed in claim 11, wherein the test arrangement further comprises an N-bit digitizing stage coupled between the sensing means and an output of the integrated circuit, N being a positive integer.

13. An integrated circuit as claimed in claim 11, wherein the current sensing means comprise a plurality of current sensors, each of the current sensors being placed in a branch of the power supply to a respective analog stage.

14. An integrated circuit as claimed in claim 13, wherein the test data output means comprise a plurality of N-bit digitizers coupled to a digital bus, each current sensor being coupled to a respective N-bit digitizer for digitizing an output of its associated current sensor, N being a positive integer.

15. An integrated circuit as claimed in claim 8, the test data output means further comprising an N-bit digitizing stage coupled between the further analog bus and an output of the integrated circuit, N being a positive integer.

16. An integrated circuit as claimed in claim 15, wherein the N-bit digitizing stage comprises N comparators, each having an input coupled to the further analog bus, a further input coupled to a reference signal source and an output for outputting a comparator result signal.

17. An integrated circuit as claimed in claim 16, wherein the reference signal source comprises the analog bus.

18. An integrated circuit as claimed in claim 1, further comprising a plurality of N-bit digitizing stages and a plurality of further switches, each of the digitizing stages being coupled between an output of a respective analog stage via a further switch from the plurality of further switches and the test data output means.

19. An integrated circuit as claimed in claim 18, further comprising a further shift register for controlling the plurality of further switches.

20. An integrated circuit as claimed in claim 9, wherein the shift register and/or the further shift register form a part of a test access port controller that is compliant with the boundary scan standard IEEE 1149.1.

21. A method for testing an integrated circuit comprising a chain of analog stages, each analog stage having a signal input and a signal output, the signal output of a predecessor analog stage in the chain being coupled to the signal input of a successor analog stage in the chain;
   powering means for powering the analog stages, the powering means comprising a power supply infrastructure and a biasing infrastructure, each analog stage being coupled to a branch of the power supply infrastructure and a branch of the biasing infrastructure, the method comprising:
   providing a test arrangement for testing the plurality of analog stages, the test arrangement comprising test data input means, each analog stage having its signal input configurably coupled to the test data input means; test data output means, each analog stage having its signal output configurably coupled to the test data input means; selection means located in the powering means for selectively decoupling an analog stage from the powering means; and control means for controlling the selection means and the configurable coupling of an analog stage to the test data input means and the test data output means;

connecting one or more analog stages to the powering means by configuring the switching means through the control means;

providing test data via the test data input means to an analog stage that is connected to the powering means; and collecting a test result from said connected analog stage.

22. A method as claimed in claim 21, wherein the step of connecting one or more analog stages to the powering means by configuring the switching means through the control means comprises configuring a plurality of switches placed in the branches of the biasing infrastructure.

23. A method as claimed in claim 22, further comprising:

providing the branches of the power supply infrastructure with a further plurality of switches;

disabling a subset of the plurality of switches to decouple a subset of analog stages from the biasing infrastructure; and enabling a subset of the further plurality of switches such that the subset of analog stages is coupled to a supply terminal for preventing floating nodes in the subset of analog stages.

24. An integrated circuit test arrangement comprising an integrated circuit as claimed in claim 1 coupled to a test apparatus, the test apparatus comprising a current sensor coupled to an output of the integrated circuit for sensing an output voltage of the integrated circuit.

25. A integrated circuit test arrangement as claimed in claim 24 wherein the output of the integrated circuit is coupled to the test data output means.

* * * * *